(12) United States Patent
Lee et al.

(10) Patent No.: US 11,705,512 B2
(45) Date of Patent: Jul. 18, 2023

(54) HIGH ELECTRON MOBILITY TRANSISTOR (HEMT) AND FORMING METHOD THEREOF

(71) Applicant: UNITED MICROELECTRONICS CORP., Hsin-Chu (TW)

(72) Inventors: Kuo-Hsing Lee, Hsinchu County (TW); Yi-Chung Sheng, Tainan (TW); Sheng-Yuan Hsueh, Tainan (TW); Chih-Kai Kang, Tainan (TW); Guan-Kai Huang, Tainan (TW); Chien-Liang Wu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/676,799

(22) Filed: Feb. 21, 2022

(65) Prior Publication Data

US 2022/0173236 A1 Jun. 2, 2022

Related U.S. Application Data

(63) Continuation of application No. 16/525,513, filed on Jul. 29, 2019, now Pat. No. 11,296,214.

(30) Foreign Application Priority Data

Jul. 18, 2019 (CN) .......................... 201910649098.6

(51) Int. Cl.
*H01L 29/778* (2006.01)
*H01L 29/66* (2006.01)

(52) U.S. Cl.
CPC .... *H01L 29/7787* (2013.01); *H01L 29/66462* (2013.01)

(58) Field of Classification Search
CPC ............ H01L 29/0619; H01L 29/7787; H01L 29/66462; H01L 29/402
See application file for complete search history.

(56) References Cited

U.S. PATENT DOCUMENTS 9,385,001 B1 * 7/2016 He .................... H01L 21/32133
10,002,956 B1 * 6/2018 Lin .................... H01L 29/7786
(Continued)

FOREIGN PATENT DOCUMENTS

CN        102857202      12/2014
JP        2007-242746    9/2007

OTHER PUBLICATIONS

Sheng Jiang et al., All-GaN-Integrated Cascode Heterojunction Field Effect Transistors, IEEE Transactions on Power Electronics, Nov. 2017, pp. 8743-8750, vol. 32, No. 11, XP055691900.

*Primary Examiner* — Vongsavanh Sengdara
(74) *Attorney, Agent, or Firm* — Winston Hsu

(57) ABSTRACT

A high electron mobility transistor (HEMT) includes a carrier transit layer, a carrier supply layer, a main gate, a control gate, a source electrode and a drain electrode. The carrier transit layer is on a substrate. The carrier supply layer is on the carrier transit layer. The main gate and the control gate are on the carrier supply layer. A fluoride ion doped region is formed right below the main gate in the carrier supply layer. The source electrode and the drain electrode are at two opposite sides of the main gate and the control gate, wherein the source electrode is electrically connected to the control gate by a metal interconnect. The present invention also provides a method of forming a high electron mobility transistor (HEMT).

8 Claims, 8 Drawing Sheets

(56) References Cited

U.S. PATENT DOCUMENTS

| | | | |
|---|---|---|---|
| 2009/0032820 A1 | 2/2009 | Chen | |
| 2012/0218783 A1* | 8/2012 | Imada | H01L 29/0619 |
| | | | 257/76 |
| 2013/0083569 A1* | 4/2013 | Minoura | H01L 29/872 |
| | | | 257/734 |
| 2013/0193485 A1 | 8/2013 | Akiyama | |
| 2016/0336313 A1 | 11/2016 | Jeon | |
| 2016/0372557 A1 | 12/2016 | Liao | |
| 2017/0309736 A1* | 10/2017 | Huang | H01L 29/155 |
| 2018/0158936 A1 | 6/2018 | Chen | |

* cited by examiner

HIGH ELECTRON MOBILITY TRANSISTOR (HEMT) AND FORMING METHOD THEREOF

CROSS REFERENCE TO RELATED APPLICATIONS

This application is a continuation application of U.S. application Ser. No. 16/525,513, filed on Jul. 29, 2019. The content of the application is incorporated herein by reference.

BACKGROUND OF THE INVENTION

1. Field of the Invention

The present invention relates to a high electron mobility transistor (HEMT) and forming method thereof, and more particularly, to a high electron mobility transistor (HEMT) electrically connecting a control gate to a source electrode and forming method thereof.

2. Description of the Prior Art

High electron mobility transistor (HEMT) has various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow high electron mobility transistor (HEMT) to be used in numerous applications including high intensity light emitting diodes (LEDs), power switching devices, regulators, battery protectors, display panel drivers, and communication devices.

High electron mobility transistor (HEMT) is also a field effect transistor, which has a carrier channel formed from a heterojunction at the interface between layers having different bandgap. Ternary compound semiconductors such as gallium arsenide or aluminium gallium arsenide may be utilized to constitute this kind of devices. Instead, other materials may be applied. For instance, indium containing devices have good performance in high frequencies. Gallium nitride (GaN) high electron mobility transistors (HEMT) attract attention recently due to its good performance in high frequencies.

SUMMARY OF THE INVENTION

The present invention provides a high electron mobility transistor (HEMT) and forming method thereof, which electrically connects a control gate to a source electrode, to reduce voltage difference between a main gate and a drain electrode.

The present invention provides a high electron mobility transistor (HEMT) includes a carrier transit layer, a carrier supply layer, a main gate, a control gate, a source electrode and a drain electrode. The carrier transit layer is on a substrate. The carrier supply layer is on the carrier transit layer. The main gate and the control gate are on the carrier supply layer. A fluoride ion doped region is formed right below the main gate in the carrier supply layer. The source electrode and the drain electrode are at two opposite sides of the main gate and the control gate, wherein the source electrode is electrically connected to the control gate by a metal interconnect.

The present invention provides a method of forming a high electron mobility transistor (HEMT) including the following steps. A carrier transit layer and a carrier supply layer are sequentially formed on a substrate. A main gate and a control gate are formed on the carrier supply layer. A source electrode and a drain electrode are formed at two opposite sides of the main gate and the control gate. The source electrode is electrically connected to the control gate by a metal interconnect.

According to the above, the present invention provides a high electron mobility transistor (HEMT) and forming method thereof, which forms a carrier transit layer and a carrier supply layer on a substrate sequentially; forms a main gate and a control gate on the carrier supply layer; forms a source electrode and a drain electrode at two opposite sides of the main gate and the control gate; and electrically connects the source electrode to the control gate by a metal interconnect. Since the control gate is located between the main gate and the drain electrode, and the control gate is electrically connected to the source electrode, voltage difference between the main gate and the drain electrode can be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
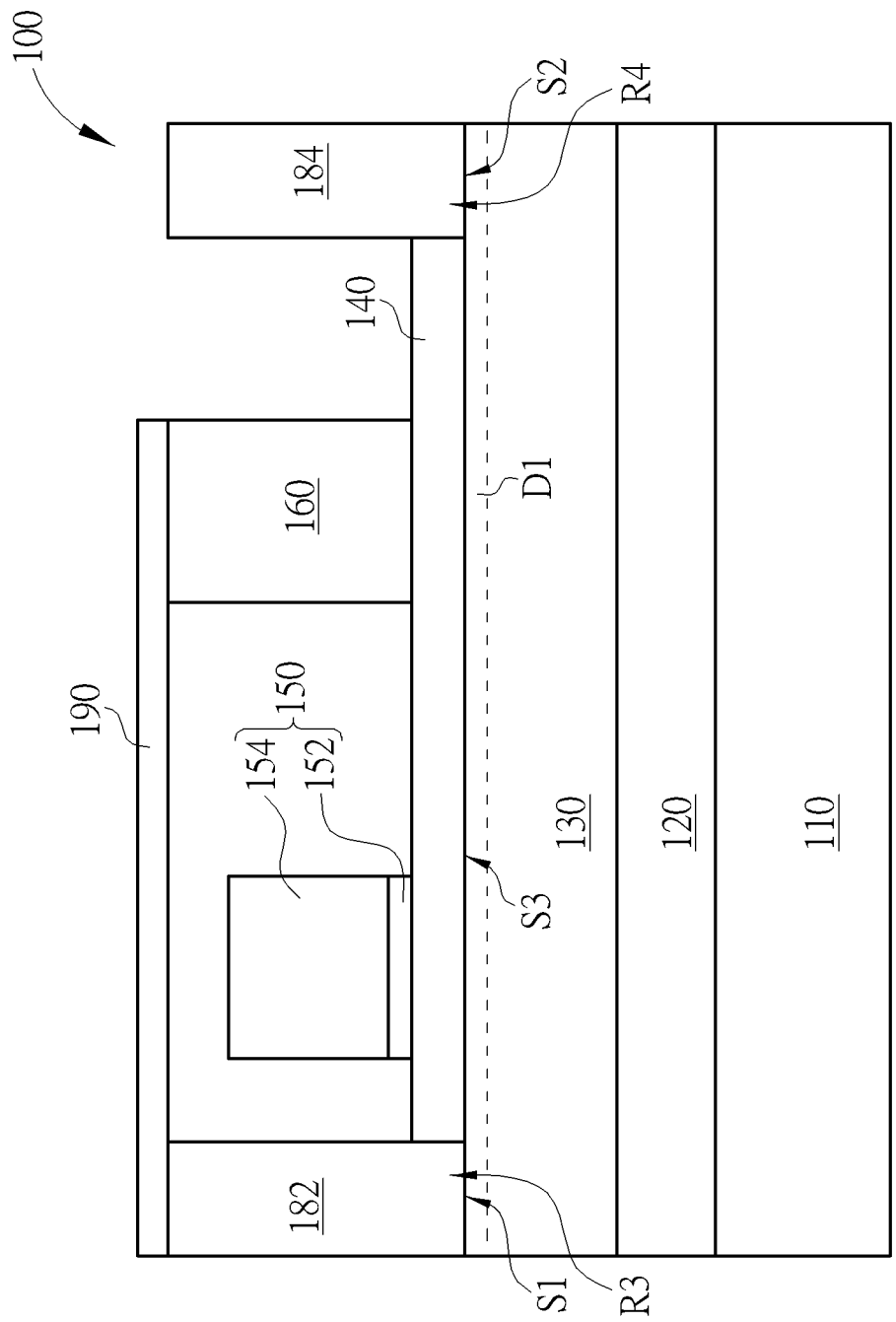
FIG. 1 schematically depicts a cross-sectional view of a high electron mobility transistor (HEMT) according to an embodiment of the present invention.

FIG. 1 schematically depicts a cross-sectional view of a high electron mobility transistor (HEMT) according to an embodiment of the present invention. As shown in FIG. 1, a substrate 110 is provided. The substrate 110 may be a semiconductor substrate such as a silicon substrate, a silicon containing substrate, a III-V group-on-silicon (such as GaNon-silicon) substrate, a silicon carbide substrate, an aluminum oxide substrate, a graphene-on-silicon substrate or a silicon-on-insulator (SOI) substrate. The substrate 110 may be a single-layered substrate, a multi-layered substrate, a gradient substrate, or combination thereof.

A buffer layer 120 is formed on the substrate 110. The buffer layer 120 may be a stacked III-V group semiconductor layer, wherein the lattice constant of the stacked III-V group semiconductor layer varies gradually from bottom to top. The buffer layer 120 may be gallium nitride (GaN) or aluminum nitride (AlN), but it is not limited thereto. The buffer layer 120 may be formed by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

A carrier transit layer 130 is formed on the buffer layer 120. In this embodiment, the carrier transit layer 130 may be a stacked III-V group semiconductor layer, but it is not limited thereto. Preferably, the carrier transit layer 130 may be an unintentionally doped (UID) gallium nitride (GaN) layer. The carrier transit layer 130 may be formed by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

A carrier supply layer 140 is formed on the carrier transit layer 130, thereby a channel region D1 being formed at an interface of the carrier transit layer 130 and the carrier supply layer 140. The channel region D1 is the region where conductive current is formed by the two-dimensional electron gas (2DEG) and in such condition the HEMT device is typically operated under a "normally on" mode. Typically a heterojunction is formed at the interface between the carrier transit layer 130 and carrier supply layer 140 as a result of the bandgap difference between the two layers 130, 140. Essentially a quantum well is formed in the banding portion of the conduction band of the heterojunction to constrain the electrons generated by piezoelectricity so that two-dimensional electron gas (2DEG) is formed at the junction between the carrier transit layer 130 and carrier supply layer 140 to form conductive current.

In this embodiment, the carrier supply layer 140 may be a III-V group semiconductor layer, but it is not limited thereto. Preferably, the carrier supply layer 140 may be an unintentionally doped (UID) $Al_xGa_{1-x}N$ layer, an n-type $Al_xGa_{1-x}N$ layer or a p-type $Al_yGa_{1-y}N$ layer. In one case, the carrier supply layer 140 may be formed by an epitaxial growth process, which may include silicon or germanium etc. Perhaps, the carrier supply layer 140 may be formed by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

A main gate 150 and a control gate 160 are formed on the carrier supply layer 140. The main gate 150 may include a bottom part 152 and a top part 154, wherein the bottom part 152 and the top part 154 preferably include different materials. Preferably, the bottom part 152 may be a p-type $Al_yGa_{1-y}N$ layer while the top part 154 may be metals or metal alloys such as gold, tungsten, cobalt, titanium, titanium nitride, molybdenum, copper, aluminum, ruthenium, palladium, silver or platinum or etc. The control gate 160 may be metals or metal alloys such as gold, tungsten, cobalt, titanium, titanium nitride, molybdenum, copper, aluminum, ruthenium, palladium, silver or platinum or etc. As current gate electrodes typically made of metal gradually imports material such as p-type gallium nitride (GaN) to serve as bottom portion for the gate electrode, the operation of HEMT devices under this circumstance now shifts from "normally on" to "normally off".

Figure 2:
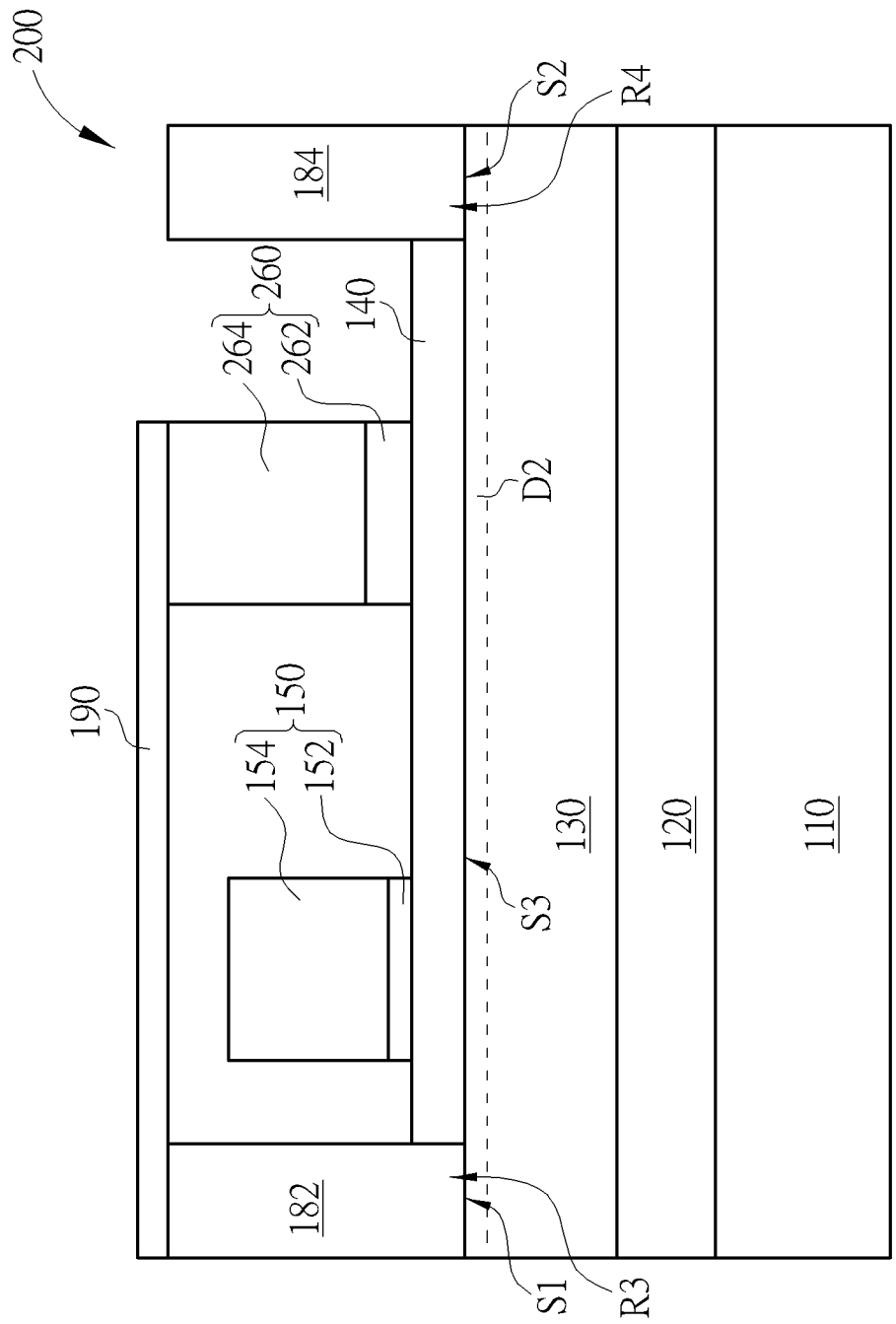
FIG. 2 schematically depicts a cross-sectional view of a high electron mobility transistor (HEMT) according to another embodiment of the present invention.

In this embodiment, the control gate 160 may only include metals or metal alloys, and the metals or the metal alloys directly contact the carrier supply layer 140. In another embodiment, as shown in FIG. 2, a control gate 260 may include a bottom part 262 and a top part 264. Preferably, the bottom part 262 may be an insulating layer, which may include aluminum nitride, silicon nitride, aluminum oxide, or combination thereof, and the top part 264 may be metals or metal alloys such as gold, tungsten, cobalt, titanium, titanium nitride, molybdenum, copper, aluminum, tantalum, palladium, silver, platinum or etc.

Figure 3:
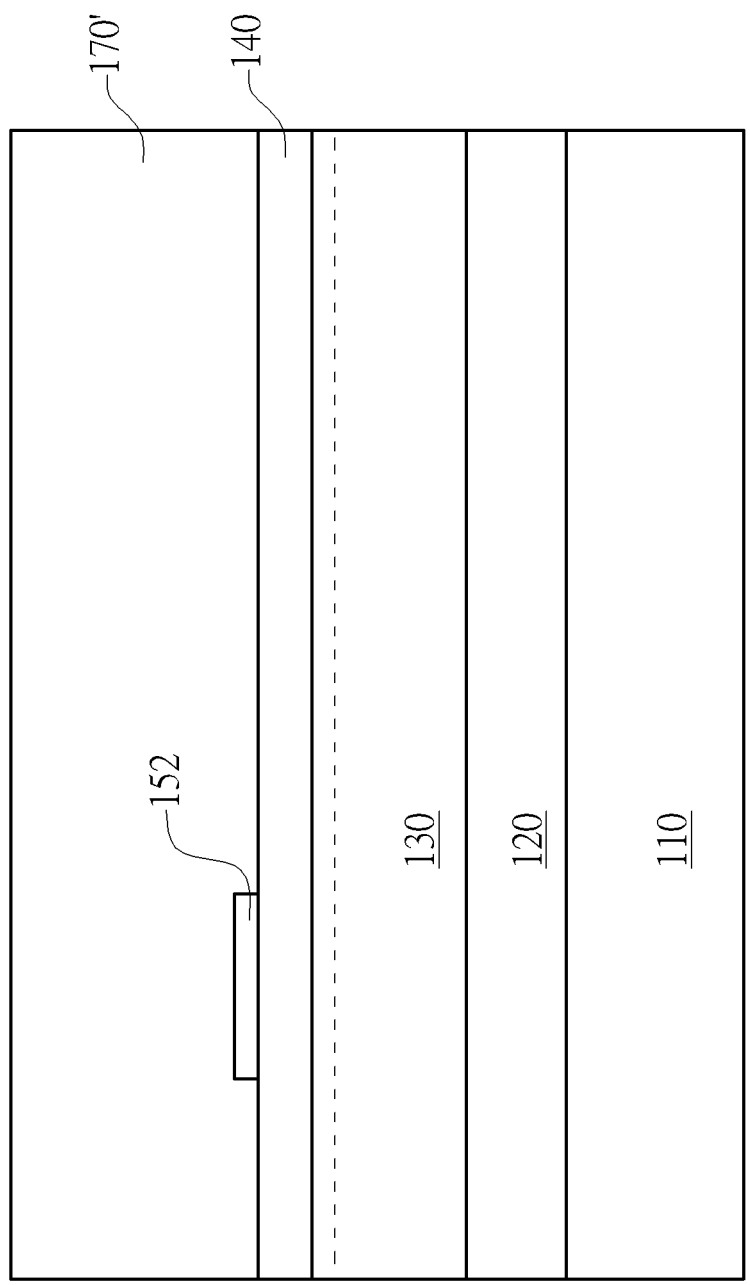
FIG. 3 schematically depicts a cross-sectional view of a method of forming a high electron mobility transistor (HEMT) according to an embodiment of the present invention.
Figure 4:
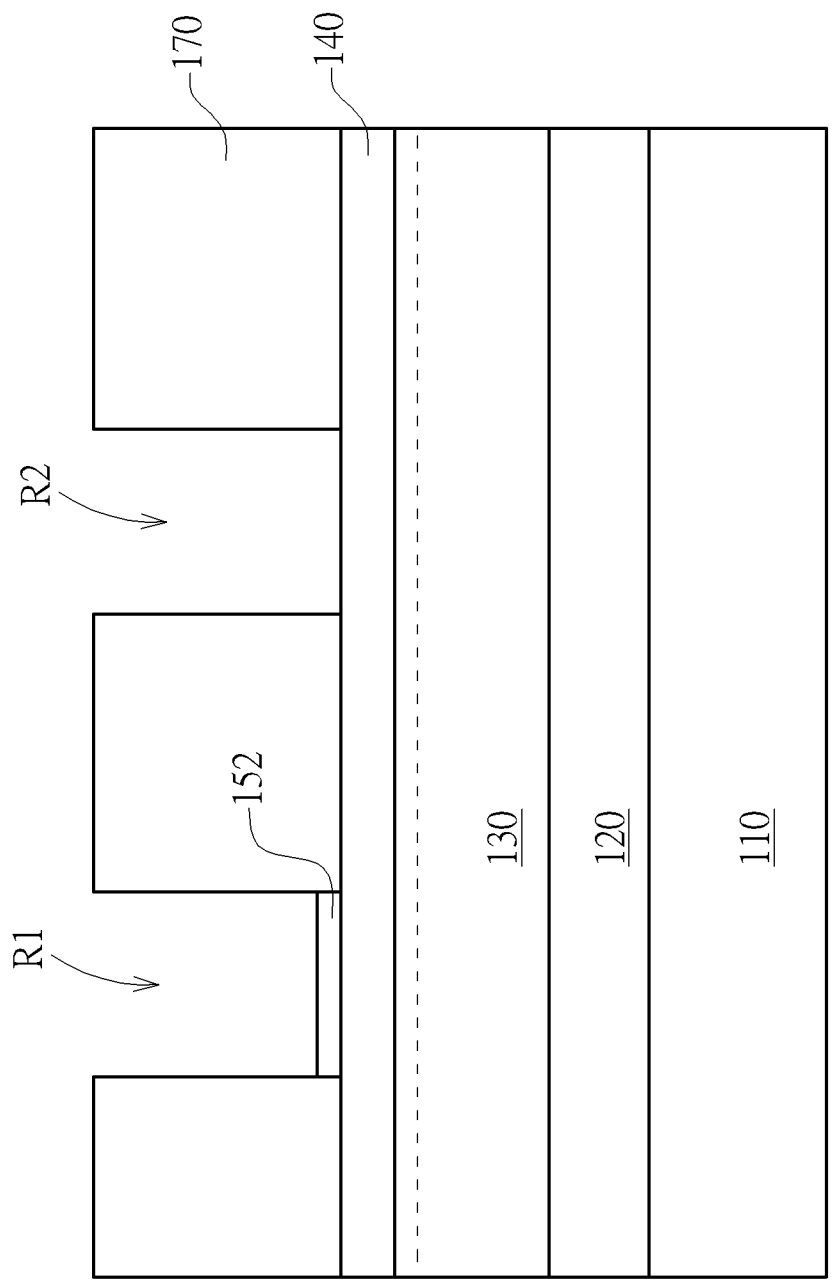
FIG. 4 schematically depicts a cross-sectional view of a method of forming a high electron mobility transistor (HEMT) according to an embodiment of the present invention.

The steps of forming the main gate 150 and the control gate 160/260 on the carrier supply layer 140 may include the following, but it is not limited thereto. As shown in FIG. 3, the bottom part 152 (being a P-type gallium nitride (GaN) layer in this embodiment) is formed on a part of the carrier supply layer 140 (the region for forming the main gate 150), which may include the following. A P-type gallium nitride (GaN) layer is deposited blanketly and then patterned to form the P-type gallium nitride (GaN) layer on the part of the carrier supply layer 140. Then, a blanket interdielectric layer 170' is formed to blanketly cover the carrier supply layer 140 and the bottom part 152. Thereafter, the blanket interdielectric layer 170' is patterned to form an interdielectric layer 170, as shown in FIG. 4. The interdielectric layer 170 include a main gate recess R1 and a control gate recess R2, wherein the main gate recess R1 exposes the bottom part 152, and the control gate recess R2 exposes the carrier supply layer 140.

Figure 5:
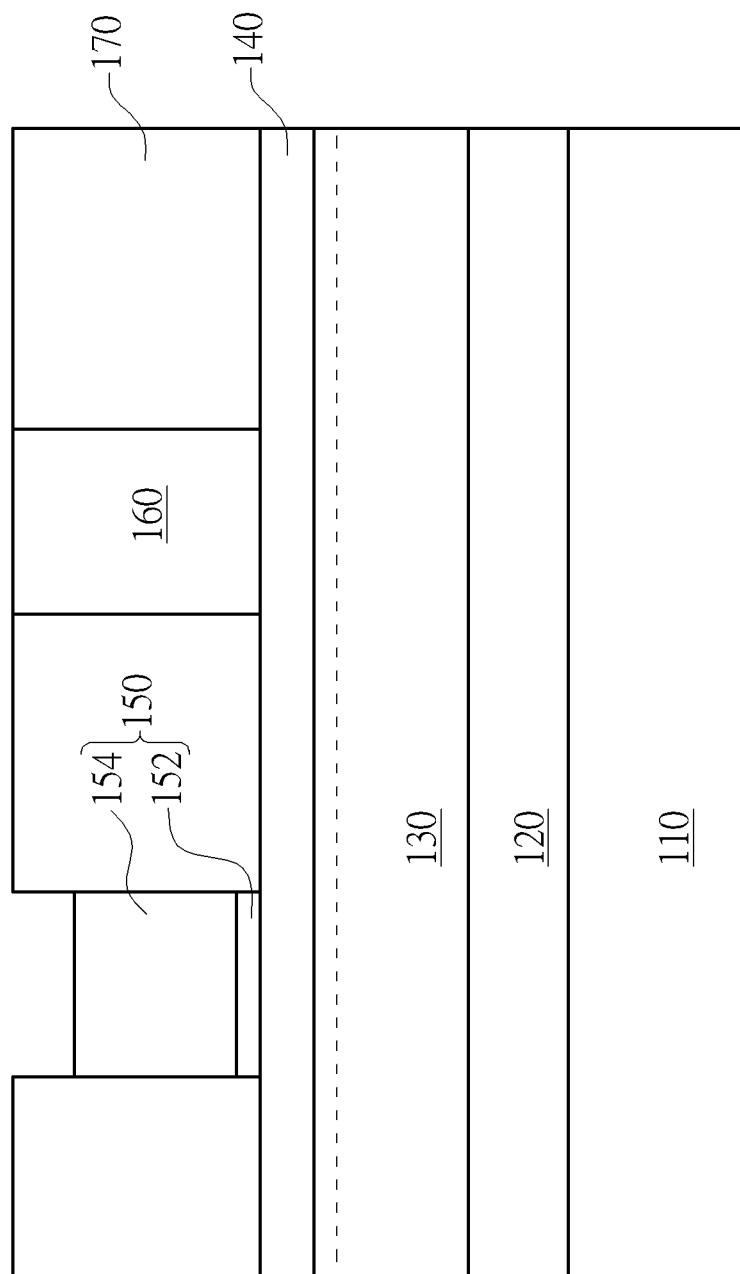
FIG. 5 schematically depicts a cross-sectional view of a method of forming a high electron mobility transistor (HEMT) according to an embodiment of the present invention.

For the embodiment of FIG. 1—as shown in FIG. 5, a metal gate is directly formed on the bottom part 152 in the main gate recess R1 for serving as the top part 154 of the main gate 150, and a metal gate is directly formed on the carrier supply layer 140 in the control gate recess R2 for serving as the control gate 160. The metal gate used for forming the top part 154 and the metal gate used for forming the control gate 160 may have common or different materials, and the metal gates are formed at a same time or are formed respectively, depending upon practical requirements.

Figure 6:
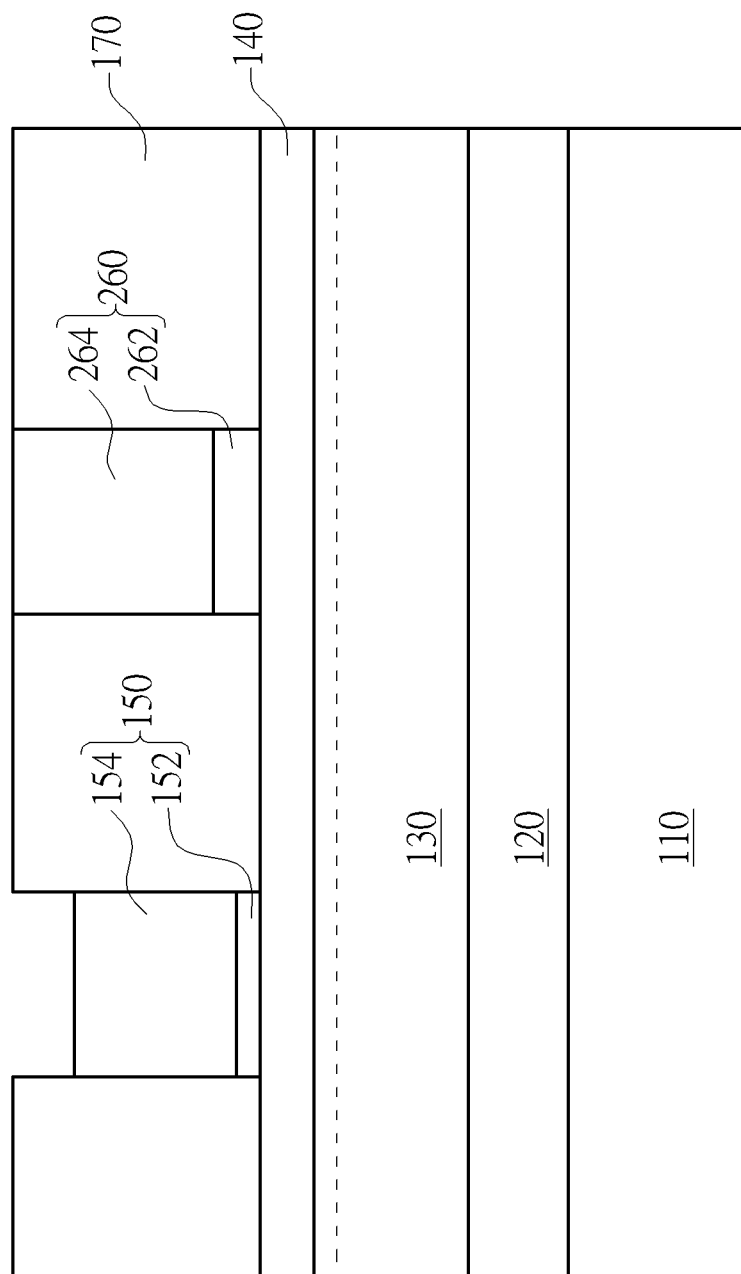
FIG. 6 schematically depicts a cross-sectional view of a method of forming a high electron mobility transistor (HEMT) according to another embodiment of the present invention.

For the embodiment of FIG. 2—as shown in FIG. 6, the bottom part 262 (being an insulating layer in this embodiment) is formed on the carrier supply layer 140 in the control gate recess R2, and then metal gates are directly formed on the bottom part 152 in the main gate recess R1, and on the bottom part 262 in the control gate recess R2 respectively, wherein the metal gate in the main gate recess R1 serves as the top part 154 of the main gate 150, and the metal gate in the control gate recess R2 serves as the top part 264 of the control gate 260. The metal gate used for forming the top part 154 and the metal gate used for forming the top part 264 may have common or different materials, and the metal gates are formed at a same time or are formed respectively, depending upon practical requirements.

Please referring to FIG. 1 or FIG. 2, a source electrode 182 and a drain electrode 184 are formed at two opposite sides of the main gate 150 and the control gate 160. Methods of forming the source electrode 182 and the drain electrode 184 at the two opposite sides of the main gate 150 and the control gate 160 may include the following. The carrier supply layer 140 is etched to form a source recess R3 and a drain recess R4 in the carrier supply layer 140 at the two opposite sides of the main gate 150 and the control gate 160.

The source electrode 182 is formed in the source recess R3 and the drain electrode 184 is formed in the drain recess R4.

A bottom surface S1 of the source electrode 182, a bottom surface S2 of the drain electrode 184 and a bottom surface S3 of the carrier supply layer 140 are coplanar, to directly contact a channel region D1/D2 (meaning a two-dimensional electron gas (2DEG) channel) at an interface of the carrier transit layer 130 and the carrier supply layer 140. The source electrode 182 and the drain electrode 184 may be metals or metal alloys such as gold, tungsten, cobalt, titanium, titanium nitride, molybdenum, copper, aluminum, tantalum, palladium, silver or platinum or etc.

The source electrode 182 is electrically connected to the control gate 160/260 by a metal interconnect 190. The metal interconnect 190 may be formed by a dual damascene process or a single damascene process etc, wherein the metal interconnect 190 may be a metal line disposed over but without contacting the main gate 150, and the metal interconnect 190 directly contacts the source electrode 182 to the control gate 160/260, but it is not limited thereto. Therefore, a high electron mobility transistor (HEMT) 100/200 is formed.

Above all, due to the control gate 160/260 being formed between the main gate 150 and the drain electrode 184, and the metal interconnect 190 electrically connects the source electrode 182 to the control gate 160/260, voltage difference between the main gate 150 and the drain electrode 184 can be reduced while the device of the present invention turns off. As the source electrode 182 is 0 volt, the main gate 150 is 0 volt, and the drain electrode 184 is 600 volts, the voltage difference between the main gate 150 and the drain electrode 184 can decrease to 200-300 volts from 600 volts by using the control gate 160/260.

Figure 7:
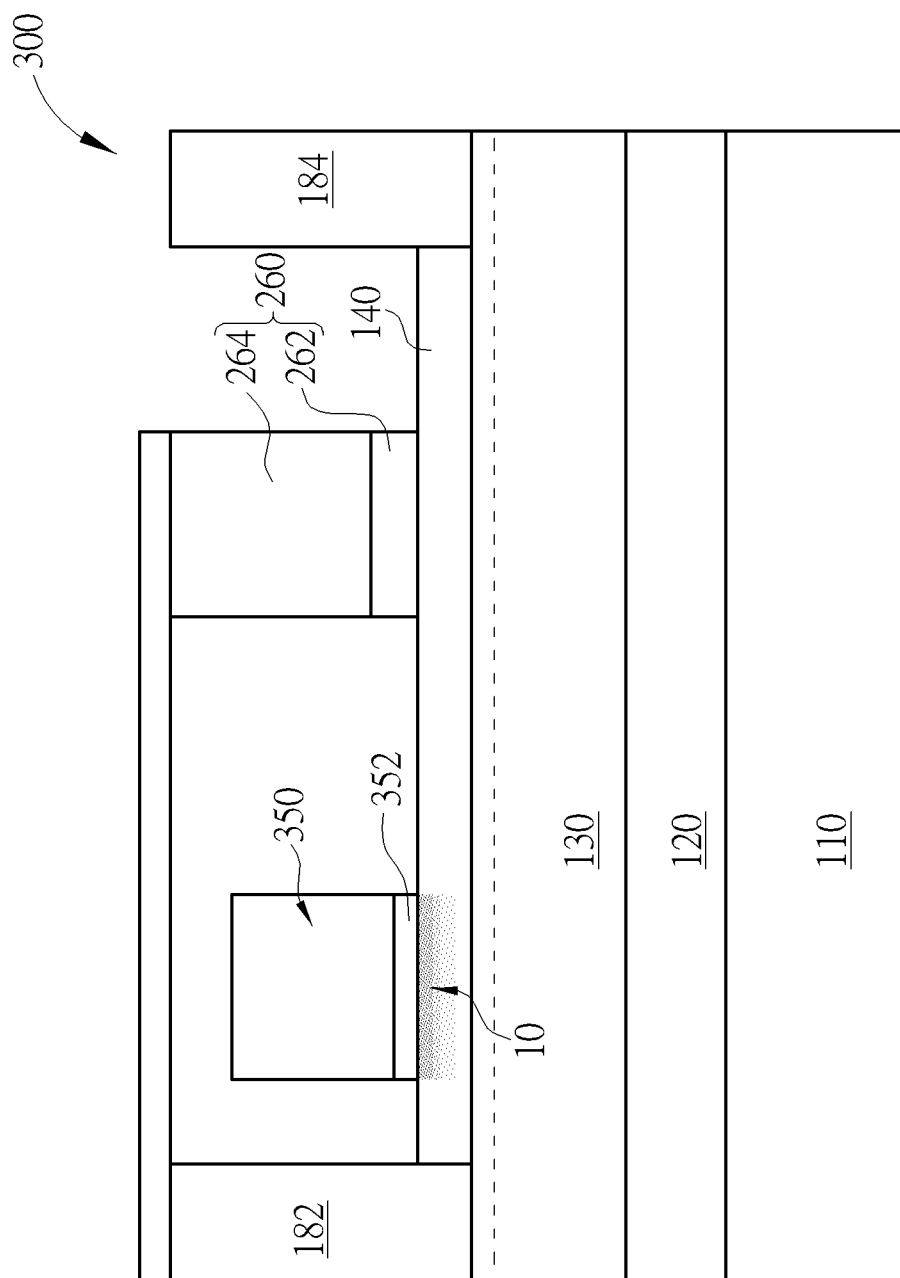
FIG. 7 schematically depicts a cross-sectional view of a high electron mobility transistor (HEMT) according to another embodiment of the present invention.

The high electron mobility transistor (HEMT) 100/200 including the main gate 150 with P-type $Al_yGa_{1-y}N$ is presented above, but the present invention can be applied in other high electron mobility transistors (HEMTs). FIG. 7 schematically depicts a cross-sectional view of a high electron mobility transistor (HEMT) 300 including a main gate doped with fluorine according to another embodiment of the present invention. The difference between this embodiment and the embodiment of FIG. 2: the main gate 150 is replaced by a main gate 350. The main gate 350 may be composed of metals or metal alloys such as gold, tungsten, cobalt, titanium, titanium nitride, molybdenum, copper, aluminum, tantalum, palladium, silver, platinum or etc, but it is not limited thereto. In this embodiment, fluorine is doped in the carrier supply layer 140 right below the main gate 350, thereby forming a fluoride ion doped region 10 right below the main gate 350, wherein the step of doping fluorine may be processed after the main gate 350 and the control gate 260 are formed, and before the source electrode 182 and the drain electrode 184 are formed, but it is not limited thereto. Preferably, a bottom part of the main gate 350 may include an insulating layer 352 directly on the fluoride ion doped region 10. The insulating layer 352 may include a stacked layer constituted by aluminum nitride, silicon nitride, aluminum oxide or etc. In one case, the insulating layer 352 and the bottom part 262 (, which is also an insulating layer) of the control gate 260 have common thicknesses. In other cases, a thickness of the insulating layer 352 is less than a thickness of the bottom part 262, depending upon practical requirements. The insulating layer 352 and the bottom part 262 of the control gate 260 are formed at a same time or are formed respectively. Thus, the voltage difference between the main gate 350 and the drain electrode 184 can be reduced while the high electron mobility transistor (HEMT) 300 turns off.

Figure 8:
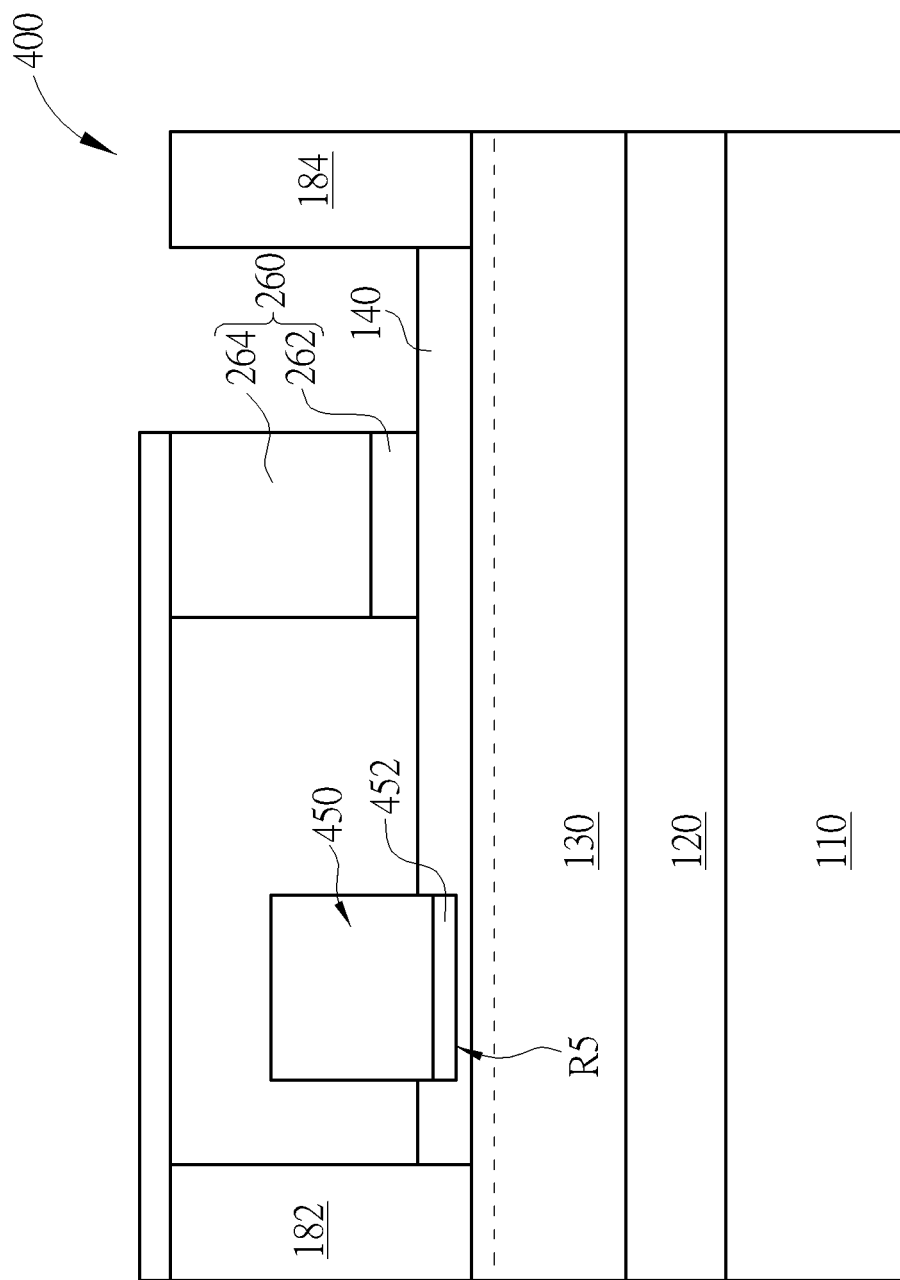
FIG. 8 schematically depicts a cross-sectional view of a high electron mobility transistor (HEMT) according to another embodiment of the present invention.

FIG. 8 schematically depicts a cross-sectional view of a high electron mobility transistor (HEMT) 400 including a recessed main gate according to another embodiment of the present invention. The difference between this embodiment and the embodiment of FIG. 2: the main gate 150 is replaced by a main gate 450. The main gate 450 may be composed of metals or metal alloys such as gold, tungsten, cobalt, titanium, titanium nitride, molybdenum, copper, aluminum, tantalum, palladium, silver, platinum or etc, but it is not limited thereto. In this embodiment, a recess R5 is formed in the carrier supply layer 140, and then the main gate 450 is formed in the carrier supply layer 140, thereby the recessed main gate 450 being formed, but it is not limited thereto. Preferably, a bottom part of the main gate 450 may include an insulating layer 452 directly on the carrier supply layer 140. The insulating layer 452 may include a stacked layer constituted by aluminum nitride, silicon nitride, aluminum oxide or etc. In one case, the insulating layer 452 and the bottom part 262 (, which is also an insulating layer) of the control gate 260 have common thicknesses. In other cases, a thickness of the insulating layer 452 is less than a thickness of the bottom part 262 of the control gate 260, depending upon practical requirements. The insulating layer 452 and the bottom part 262 of the control gate 260 are formed at a same time or are formed respectively. Thus, the voltage difference between the main gate 450 and the drain electrode 184 can be reduced while the high electron mobility transistor (HEMT) 400 turns off.

To summarize, the present invention provides a high electron mobility transistor (HEMT) and forming method thereof, which forms a carrier transit layer and a carrier supply layer on a substrate sequentially; forms a main gate and a control gate on the carrier supply layer; forms a source electrode and a drain electrode at two opposite sides of the main gate and the control gate; and electrically connects the source electrode to the control gate by a metal interconnect. Since the control gate is located between the main gate and the drain electrode, and the control gate is electrically connected to the source electrode, the voltage difference between the main gate and the drain electrode can be reduced.

Methods of forming the control gate between the main gate and the drain electrode, and electrically connecting the control gate to the source electrode can be applied in various high electron mobility transistors (HEMTs). For example, a high electron mobility transistor (HEMT) including a P-type $Al_xGa_{1-x}N$ main gate, a high electron mobility transistor (HEMT) including a fluorine doped main gate or a high electron mobility transistor (HEMT) including a recessed main gate. Insulating layers are selectively formed in bottom parts of the main gate and the control gate, and relative thicknesses of the insulating layers of the main gate and the control gate depend upon practical requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:

a carrier transit layer on a substrate;

a carrier supply layer on the carrier transit layer;

a main gate and a control gate on the carrier supply layer, wherein the main gate comprises a bottom part and a top part, and the bottom part is an insulating layer while the top part is metal, and the bottom part is formed only between the top part and the carrier supply layer;

a fluoride ion doped region formed completely right below the bottom part of the main gate in the carrier supply layer; and a source electrode and a drain electrode at two opposite sides of the main gate and the control gate, wherein the source electrode is electrically connected to the control gate by a metal interconnect.

2. The high electron mobility transistor (HEMT) according to claim 1, wherein the control gate comprises a bottom part and a top part.

3. The high electron mobility transistor (HEMT) according to claim 2, wherein the bottom part comprises an insulating layer while the top part comprises metal.

4. The high electron mobility transistor (HEMT) according to claim 1, wherein the metal interconnect comprises a metal line.

5. The high electron mobility transistor (HEMT) according to claim 1, further comprising:

a buffer layer between the substrate and the carrier transit layer.

6. The high electron mobility transistor (HEMT) according to claim 5, wherein the buffer layer comprises a stacked III-V group semiconductor layer.

7. The high electron mobility transistor (HEMT) according to claim 1, wherein the carrier transit layer comprises an unintentionally doped (UID) gallium nitride (GaN) layer.

8. The high electron mobility transistor (HEMT) according to claim 1, wherein the carrier supply layer comprises an unintentionally doped (UID) $Al_xGa_{1-x}N$ layer, an n-type $Al_xGa_{1-x}N$ layer or a p-type $Al_yGa_{1-y}N$ layer.

* * * * *